US006252780B1

United States Patent
Quinn

(10) Patent No.: US 6,252,780 B1
(45) Date of Patent: Jun. 26, 2001

(54) CONSTRUCTION OF SCANNING OR IMAGING ARRAYS SUITABLE FOR LARGE DOCUMENTS

(75) Inventor: Kraig A. Quinn, Webster, NY (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 09/127,461

(22) Filed: Jul. 31, 1998

(51) Int. Cl.[7] .................................................... H05K 1/11
(52) U.S. Cl. .......................... 361/792; 257/686; 257/723; 361/760; 361/803
(58) Field of Search .................................... 361/784, 790, 361/792, 767, 803, 814, 749, 735, 695, 760, 736; 439/65; 257/723, 686; 333/246; 29/832; 438/10; 347/208; 714/261

(56) References Cited

U.S. PATENT DOCUMENTS

| | | | |
|---|---|---|---|
| 4,954,197 | 9/1990 | Jedlicka et al. | 156/273.7 |
| 4,976,802 | 12/1990 | LeBlanc | 756/273.5 |
| 5,034,083 | 7/1991 | Campanelli et al. | 156/273.5 |
| 5,272,113 | 12/1993 | Quinn | 437/205 |
| 5,329,418 | * 7/1994 | Tanabe | 361/695 |
| 5,426,566 | * 6/1995 | Beilstein | 361/735 |
| 5,428,190 | * 6/1995 | Stopperan | 174/261 |
| 5,521,794 | * 5/1996 | Hargrave et al. | 361/814 |
| 5,528,272 | 6/1996 | Quinn et al. | 347/42 |
| 5,691,209 | * 11/1997 | Liberkowski | 438/10 |
| 6,121,988 | * 9/2000 | Uchiyama | 347/208 |

* cited by examiner

Primary Examiner—Jayprakash N. Gandhi
Assistant Examiner—Thanh Tran
(74) Attorney, Agent, or Firm—R. Hutter

(57) ABSTRACT

Semiconductor chips, such as photosensor arrays in a full-width scanner, are mounted on printed wiring boards. The printed wiring boards are in turn mounted on a second layer of printed wiring board material. The two layers of printed wiring board material are attached so that the seams between adjacent printed wiring boards in each layer alternate in a brick-like fashion. This structure enables arrays of semiconductor chips to be constructed in relatively long lengths, with minimal risk of damage caused by thermal stresses.

12 Claims, 2 Drawing Sheets

CONSTRUCTION OF SCANNING OR IMAGING ARRAYS SUITABLE FOR LARGE DOCUMENTS

FIELD OF THE INVENTION

The present invention is directed to very large linear arrays of either photosensors or image-creating structures, which can be made to relatively long lengths, such as up to 50 inches, such as to create or record posters or engineering drawings.

BACKGROUND OF THE INVENTION

Image sensors for scanning document images typically have a row or linear array of photosensors together with suitable supporting circuitry integrated onto a silicon chip. Analogous devices for creating images in response to digital image data, such as LED printbars in xerographic printers, or ink-jet printheads, include a linear array of image creating structures similarly integrated onto a silicon chip. In either case, because of the difficulty in economically designing and fabricating an array comparable in length to the width of an image to be created or recorded, various additional structures must be used. In the scanning context, it is typical to require optical reduction of an original image so the light from the image is reduced to the array of a single chip; in ink-jet printing, a single chip is caused to reciprocate for numerous swaths across an image substrate. However, it would be preferable in many ways to provide a structure, either for recording or image creation, which creates or records a very large image on a one-to-one basis.

In the scanning context, there currently is available on the market a "full-width-array" scanning device, such as shown for example, in U.S. Pat. No. 5,272,113, in which up to 20 individual silicon chips, each with a small linear array of imaging structures thereon, are butted end-to-end to form what is effectively a single page-width array of photosensors. As alluded to in the '113 patent, a practical problem incident to abutting a plurality of chips into a single full-width array involves spacing the chips relative to each other so that the long array of photosensors formed by the plurality of chips is of a substantially even spacing with a minimum of anomalies, particularly between the last photosensor of one chip and the first photosensor of the next. Further complicating the spacing problem is the question of the thermal coefficient of expansion, or TCE, of the chips themselves, and in particular of the chips relative to the member on which the chips are mounted within the apparatus. Such a thermal mismatch could cause undesirable bowing of the assembly, much in the manner of a bimetallic strip. Such mechanical stressing of the relatively brittle silicon chips is likely to damage the chips.

In the context of apparatus for recording or creating very large images such as posters or engineering drawings, which may be up to 50 inches long in a critical dimension, the creation of very long imaging structures out of butted silicon chips becomes highly problematic. The present invention is directed to a structure of a very long linear array of imaging chips (such as comprising photosensors, LEDs, or portions of ink-jet ejectors) in which some of the practical problems are surmounted.

DESCRIPTION OF THE PRIOR ART

U.S. Pat. No. 4,954,197 discloses a process for fabricating a full-width array in which a plurality of small chips are bonded onto the metallic covering of an elongated substrate by an electrically conductive heat activated adhesive, in which a photocurable adhesive is used to temporarily retain the smaller chips in position while the heat activated adhesive is cured.

U.S. Pat. No. 4,976,802 discloses a process for fabricating a long scanning or printing array, in which a number of chips are bonded onto a glass substrate using a photocurable adhesive to form a subassembly. The subassembly is then inverted and joined to a second substrate having a conductive surface using a conductive heat activated adhesive.

U.S. Pat. No. 5,034,083 discloses a process for fabricating a scanning or printing array, in which a number of small scanning or printing chips are bonded onto the surface of a glass substrate having an opaque thermally and/or electrically conductive coating thereon, with the coating removed at discrete sites to allow a photocurable adhesive placed at the sites to be cured through exposure to UV light from underneath the substrate.

U.S. Pat. No. 5,272,113 discloses a photosensor array in which semiconductor chips are mounted on a substrate. After the chips are tacked onto the substrate with uncured epoxy, the assembly is brought to a low temperature prior to the heating of the curing step. The cooling step enables the tacked chips to self-space before the epoxy is cured.

U.S. Pat. No. 5,528,272 discloses a full-width array structure having materials with both a high thermal coefficient of expansion and a low thermal coefficient of expansion. A suitable adhesive provides lateral give while firmly holding the respective components together. Since the various components expand and contract from a center location of the assembly, the center location is bonded by an adhesive which does not provide lateral give, so that alignment between parts are maintained while the remainder of the respective components float relative to each other and prevent thermally induced stresses.

SUMMARY OF THE INVENTION

According to the present invention, there is provided an imaging apparatus, comprising a first printed wiring board and a second printed wiring board, arranged whereby an edge of the first printed wiring board is adjacent an edge of the second printed wiring board, creating a seam therebetween. The first printed wiring board and the second printed wiring board each define a first main surface and a second main surface. A set of semiconductor chips are attached to the first main surface of each of the first wiring board and second wiring board. At least a portion of the second main surface of each of the first wiring board and second wiring board are attached to a second-layer board, whereby the seam between the first printed wiring board and the second printed wiring board is spaced from an edge of the second-layer board.

DETAILED DESCRIPTION OF THE INVENTION

Figure 1:
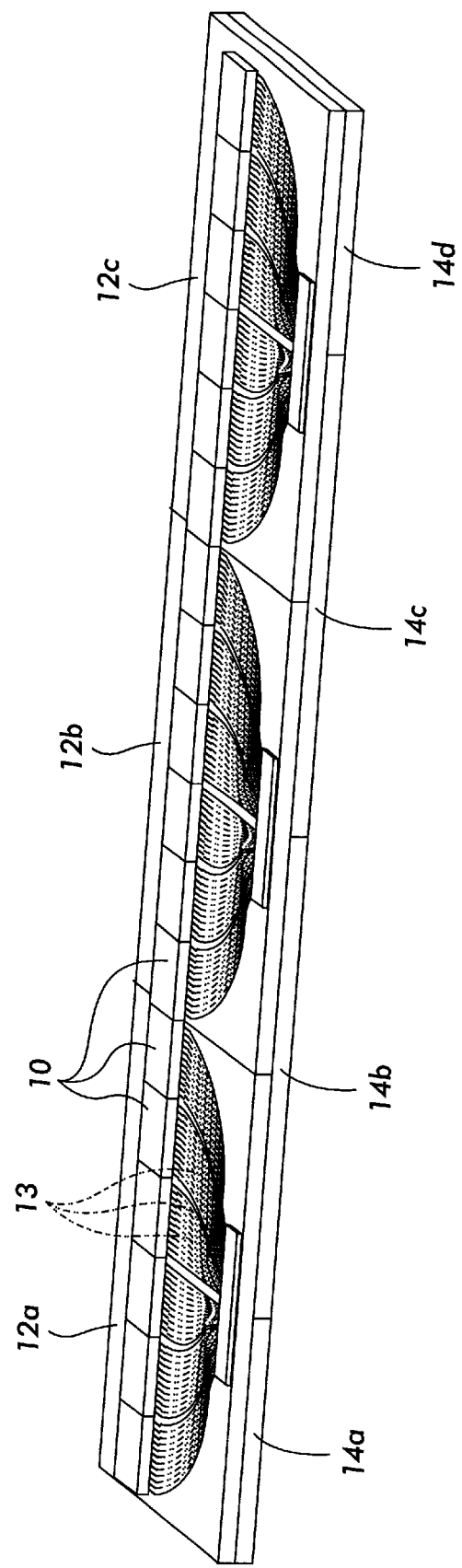
FIG. 1 is a perspective view showing an assembly of imaging chips on a substrate, according to one aspect of the present invention.

FIG. 1 is a perspective view showing an extended-length array of imaging chips, such as photosensor chips or LED emitter chips, according to one aspect of the present invention. A plurality of chips indicated each as 10, are butted end-to-end as shown to form in effect a single linear array of chips. As each chip 10 includes thereon a linear array (not shown) of structures such as photosensors or LED emitters, or portions of ink-jet ejectors, the assembled row of chips 10 in effect forms a single linear array of imaging structures, such as described, for example, in U.S. Pat. No. 5,272,113. All of the chips 10 are mounted directly onto one or another printed wiring board. The printed wiring boards are indicated in FIG. 1 as 12a, 12b, and 12c. As can be seen in the Figure, the printed wiring boards are butted to each other in such a manner that the end chips 10 on each board similarly abut each other, as shown. Each printed wiring board 12a, 12b, 12c may further include thereon printed circuitry, such as indicated as 13, which enables external circuitry to access the circuitry on each chip 10.

The printed wiring boards 12a, 12b, and 12c are in turn mounted, by an adhesive, to another set of "second-layer" printed wiring boards, here indicated as 14a, 14b, 14c, and 14d. As shown in the Figure, and according to a preferred embodiment of the present invention, the edges of printed wiring boards 14a–d abut each other at locations which alternate, in a brick-like fashion, with the seams between edges of printed wiring boards 12a and 12b or 12b and 12c. What is thus formed is a double layer of printed wiring board material, in which the "seams" between the edges of printed wiring boards in each layer are spaced from each other.

According to a preferred embodiment of the invention, because the printed wiring boards 12a–c are of the same material as the printed wiring board 14a–d, there will be no thermal stresses created between the two layers of printed wiring boards. The brick-like structure of the spaces between the wiring boards on different levels enables construction of linear arrays of great length, such as up to 50 inches.

Preferred materials for the printed wiring board include low temperature co-fired ceramic (LTCC) or alumina ($Al_2O_3$). The adhesive for binding the chips 10 to printed wiring boards 12a–c and binding printed wiring boards 12a–c to wiring boards 14a–d can include any type of heat-curable epoxy.

Figure 2:
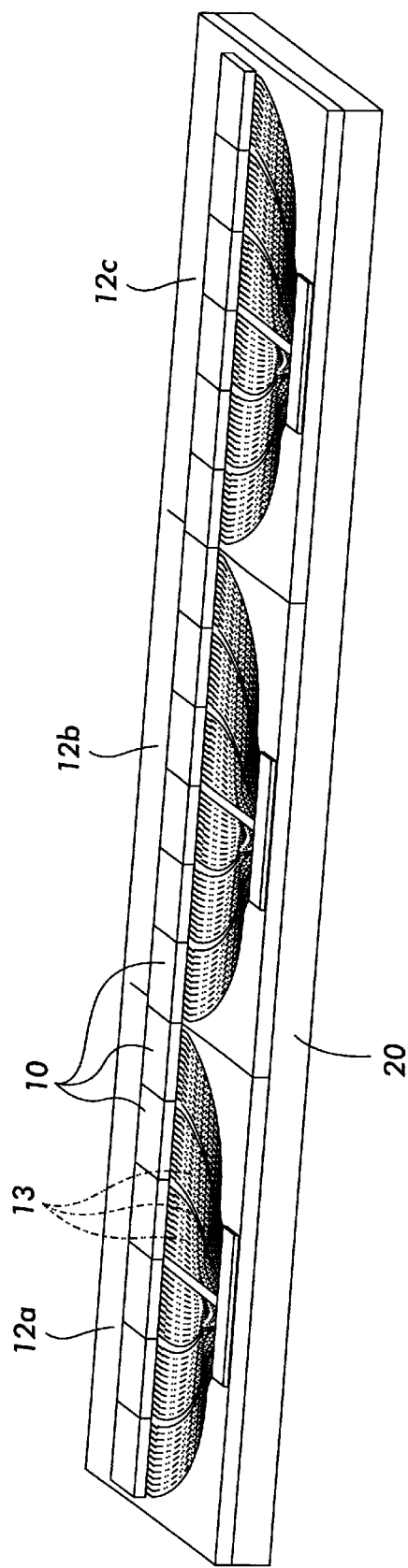
FIG. 2 is a perspective view of an assembly of imaging chips on a substrate, according to another embodiment of the invention.

FIG. 2 is a perspective view of another embodiment of the present invention wherein the printed wiring boards 12a–c, which are identical to those in the FIG. 1 embodiment, are bound to a single member, here indicated as 20. In this case, the bottom substrate 20 could be of a material which is incompatible with circuit trace forming.

In either case of the FIG. 1 or FIG. 2 embodiment, it is preferable that the seams between adjacent printed wiring boards 12a and 12b and 12b and 12c correspond to the chip-to-chip abutments of chips 10.

As is known in the prior art, particularly in U.S. Pat. No. 5,272,113, it is often desirable to place the chips 10 on any substrate so that, at operating temperatures, there is deliberately a finite gap between adjacent chips 10. This deliberate gap between adjacent chips 10 can be used to avoid stresses between chips if, for example, the underlying substrate contracts. It may be preferable in different situations to have the top printed wiring boards 12 butted tight together no gaps at the seams between printed wiring boards, so that flexure of the assembly in a direction which could drive adjacent chips together would be limited. Also, the adhesive used to bond the chips to the substrate should not extend into any chip undercut areas.

While the invention has been described with reference to the structure disclosed, it is not confined to the details set forth, but is intended to cover such modifications or changes as may come within the scope of the following claims.

What is claimed is:

1. An imaging apparatus, comprising:

a first printed wiring board and a second printed wiring board, arranged whereby an edge of the first printed wiring board is adjacent an edge of the second printed wiring board, creating a seam therebetween, the first printed wiring board and second printed wiring board each defining a first main surface and a second main surface;

a set of semiconductor chips attached to the first main surface of each of the first wiring board and second wiring board; and at least a portion of the second main surface of each of the first wiring board and second wiring board being attached to a second-layer board, whereby the seam between the first printed wiring board and the second printed wiring board is spaced from an edge of the second-layer printed wiring board.

2. The apparatus of claim 1, further comprising conductors disposed on the first main surface of each of the first wiring board and second wiring board.

3. The apparatus of claim 1, wherein the first and second printed wiring board and the second-layer board, have a substantially equal thermal coefficient of expansion.

4. The apparatus of claim 1, wherein the first and second printed wiring board and the second-layer board all substantially comprise an identical material.

5. The apparatus of claim 1, wherein the first and second printed wiring board, and the second-layer board all substantially comprise a ceramic.

6. The apparatus of claim 1, wherein the first and second printed wiring board, and the second-layer board all substantially comprise alumina.

7. The apparatus of claim 1, the semiconductor chips including photosensors.

8. The apparatus of claim 1, the semiconductor chips including light-emitting diodes.

9. The apparatus of claim 1, the semiconductor chips including a plurality of at least a portion of ink-jet ejectors.

10. The apparatus of claim 1, wherein the semiconductor chips are spaced apart from each other by a predetermined distance.

11. The apparatus of claim 1, wherein the edge of the first printed wiring board and the edge of the second printed wiring board are in contact.

12. The apparatus of claim 1, further comprising a second second-layer board, the second second-layer board including an edge abutting an edge of the first-mentioned second-layer board, and the second second-layer board being attached to the second main surface of the second printed wiring board.

* * * * *